(12) United States Patent
Oppermann et al.

(10) Patent No.: US 6,281,577 B1
(45) Date of Patent: Aug. 28, 2001

(54) CHIPS ARRANGED IN PLURALITY OF PLANES AND ELECTRICALLY CONNECTED TO ONE ANOTHER

(75) Inventors: Hans-Hermann Oppermann, Berlin; Elke Zakel, Falkensee; Ghassem Azdasht; Paul Kasulke, both of Berlin, all of (DE)

(73) Assignee: PAC Tech-Packaging Technologies GmbH, Nauen (DE)

( * ) Notice: Subject to any disclaimer, the term of this patent is extended or adjusted under 35 U.S.C. 154(b) by 0 days.

(21) Appl. No.: 08/847,961

(22) Filed: Apr. 22, 1997

(30) Foreign Application Priority Data

Jun. 28, 1996 (DE) ................................. 196 26 126

(51) Int. Cl.[7] ................................................ H01L 23/34
(52) U.S. Cl. .......................... 257/724; 257/690; 257/723; 361/749
(58) Field of Search ............................. 438/109; 257/686, 257/723, 725, 777, 690, 692, 679, 696, 693, 685, 724, 778, 787; 361/735, 730, 790, 749, 751, 760, 772, 776

(56) References Cited

U.S. PATENT DOCUMENTS

| | | | |
|---|---|---|---|
| 4,983,533 | * | 1/1991 | Go ........................................ 361/735 |
| 5,006,925 | * | 4/1991 | Bregman et al. ..................... 361/735 |
| 5,016,138 | * | 5/1991 | Woodman ............................. 257/686 |
| 5,224,023 | * | 6/1993 | Smith et al. ........................... 361/412 |
| 5,313,096 | * | 5/1994 | Eide ...................................... 257/686 |
| 5,345,205 | * | 9/1994 | Kornrumpf ........................... 333/246 |
| 5,397,916 | * | 3/1995 | Normington ......................... 257/686 |
| 5,448,511 | * | 9/1995 | Paurus et al. ......................... 257/686 |
| 5,514,907 | * | 5/1996 | Moshayedi ........................... 361/735 |
| 5,602,420 | * | 2/1997 | Ogata et al. .......................... 257/686 |
| 5,604,377 | * | 2/1997 | Palagonia ............................. 257/686 |
| 5,648,684 | * | 7/1997 | Bertin et al. .......................... 257/686 |
| 5,656,856 | * | 8/1997 | Kwoen .................................. 257/777 |
| 5,754,405 | * | 5/1998 | Derouiche ............................. 257/686 |
| 5,790,380 | * | 8/1998 | Frankeny .............................. 257/686 |
| 6,121,676 | * | 9/2000 | Solberg ................................. 257/686 |
| 6,208,521 | * | 3/2001 | Nakatsuka ............................ 361/749 |

FOREIGN PATENT DOCUMENTS

6-13727 * 1/1994 (JP) .

* cited by examiner

Primary Examiner—Olik Chaudhuri
Assistant Examiner—Alonzo Chambliss
(74) Attorney, Agent, or Firm—Darby & Darby

(57) ABSTRACT

Process for the formation of a spatial chip arrangement having several chips (32, 36, 37, 38, 39) arranged in several planes and electrically connected to one another, in which the chips are connected via their peripheral connection surfaces (33) to assigned conducting paths (23) of a conducting-path structure (24, 25) arranged on at least one carrier substrate (21, 22) by the chips being arranged either transverse to the longitudinal extent of the carrier substrate or parallel to the longitudinal extent of the flexibly constructed carrier substrate, as well as a spatial chip arrangement that is formed by means of this process.

7 Claims, 6 Drawing Sheets

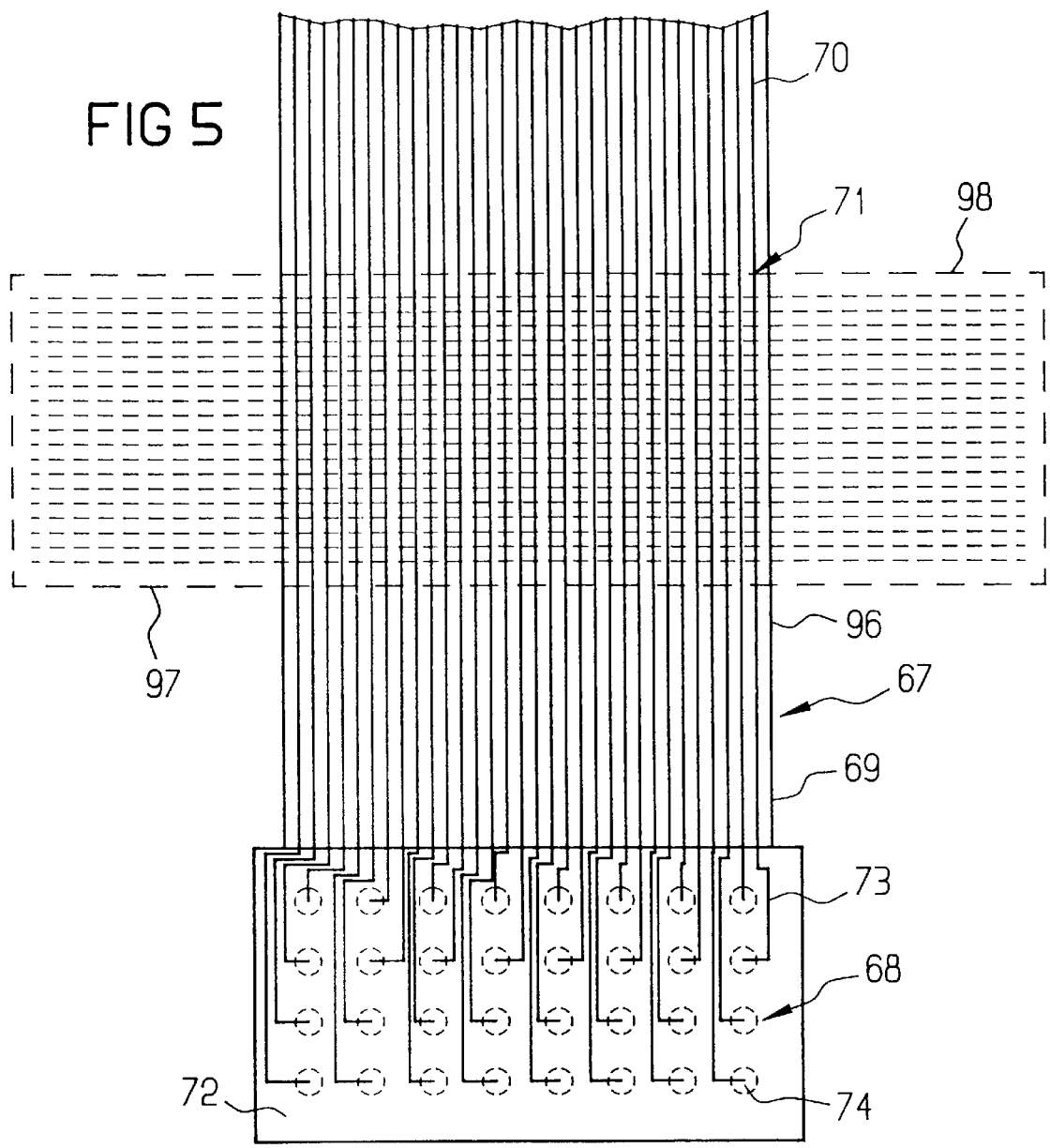
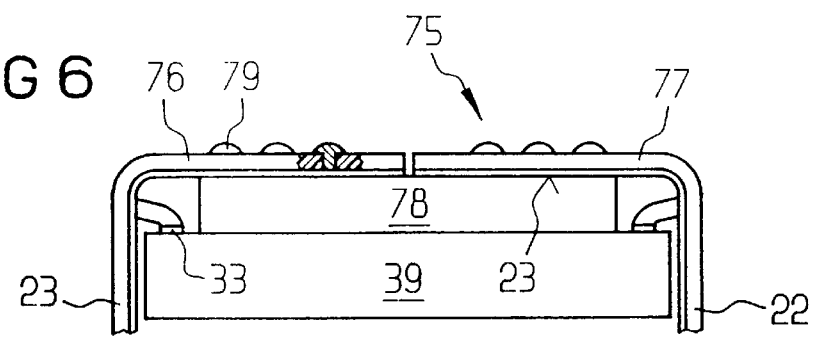

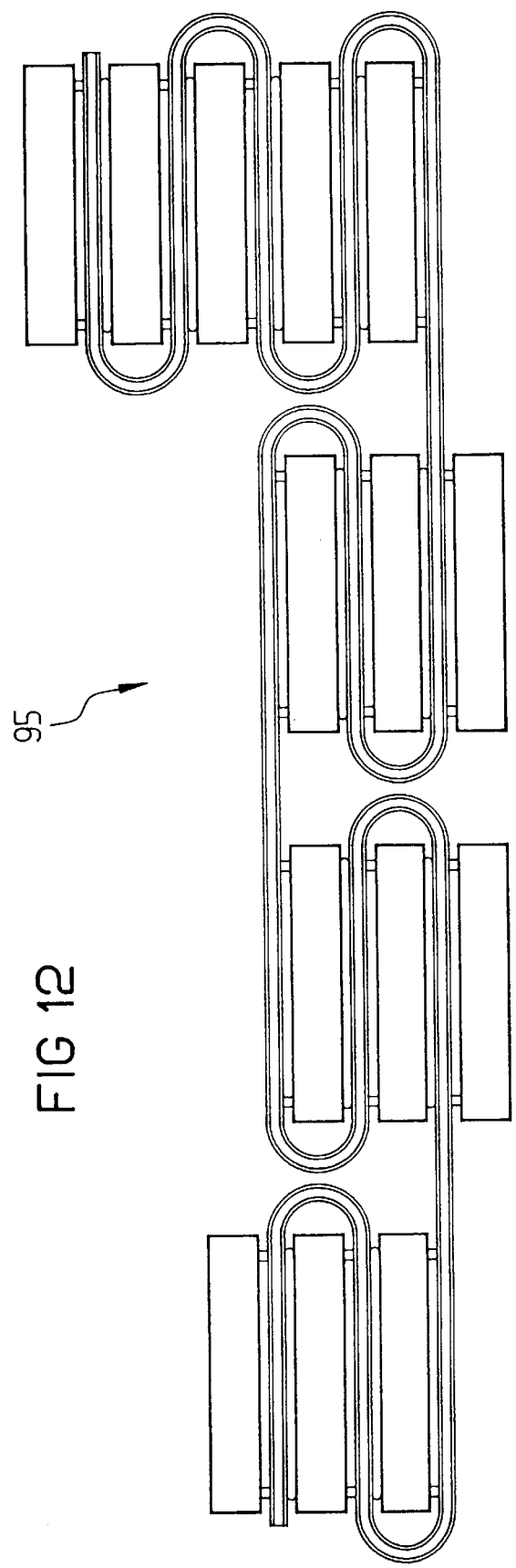

CHIPS ARRANGED IN PLURALITY OF PLANES AND ELECTRICALLY CONNECTED TO ONE ANOTHER

BACKGROUND OF THE INVENTION

The present invention relates to a process for the formation of a spatial chip arrangement and to a spatially constructed chip arrangement.

With the increasing miniaturisation of electronic appliances such as portable telephones for example, also generally designated as "handy", or portable computers, known by the expression "notebook", the demands as regards the integration density of the electronic modules employed therein also increase. To a particular degree this is unquestionably the case with memory modules which are utilised in such appliances or memory expansions which may be used optionally. At the present time, by way of structural design for such highly integrated memory modules use is made as a rule of so-called "multi-chip modules" (MCM) in which the individual chips are arranged above one another and electrically connected to one another. By reason of the high integration density—that is to say, the arrangement of a plurality of chips within an extremely small space—the probability of failure of such a memory module also increases of course, since for failure of a component it is sufficient if only one of the chips which are processed in a plurality is defective. In order to be able to eliminate failure of a component to the greatest possible extent during operation of the highly integrated modules, an examination of the modules has hitherto been undertaken after completion and prior to delivery or incorporation into the electronic appliance in question. This is associated, on the one hand, with an additional component test following the actual manufacturing process. On the other hand, the implementation of a component test only after finishing the complete component means that in the event of a component failure, which as a rule is caused only by the failure of an individual chip, the entire component is rejected.

SUMMARY OF THE INVENTION

The object underlying the present invention is therefore to propose a process for the formation of a spatial chip arrangement and also a spatial chip arrangement which, in either case, despite the fact that a high integration density is achieved, creates an opportunity for the early detection of faults so that classification of the complete component as a reject can be prevented to the greatest possible extent.

This object is achieved, respectively, by means of a process having the characteristics of claim 1 and by means a chip arrangement having the characteristics of claim 11.

In accordance with the invention it is proposed, with a view to forming a spatial chip arrangement having several chips arranged in various planes and electrically connected to one another, to contact the chips via the peripheral connection surfaces with assigned conducting paths of a conducting-path structure that is arranged on at least one carrier substrate. In this regard the chips may be arranged either transverse to the rectilinearly aligned carrier substrate or parallel to the longitudinal extent of a flexible carrier substrate.

Both alternatives according to the invention offer, on the one hand, the possibility of arranging the chips in a space-saving structure and, on the other hand, the possibility of a simple electrical examination, during manufacture of the stacked chip arrangement, of the chip that is connected to the carrier substrate.

The space-saving arrangement of the chips is created, in the one case, by the transverse arrangement of the chips relative to the longitudinal extent of the carrier substrate and, in the other case, by the fact that after establishment of the connection of the chips to the flexible carrier substrate the carrier substrate can, by reason of its flexibility, be arranged so as to correspond to the desired spatial arrangement of the chips with arbitrary changes of direction of the longitudinal extent. For instance, the flexible carrier substrate can be arranged in meandering form or even in helical form, which results in a high spatial integration density for the chips.

In the one case a particularly high integration density can be produced by the chips being brought with their peripheral connection surfaces arranged along a lateral edge into a connecting position adjacent to the conducting paths and transverse to the longitudinal extent of the conducting paths and then by a connection being effected between pairings, assigned respectively to one another, of conducting path and connection surface via a connecting material that is applied between the respective conducting path and the assigned connection surface.

In the other case a particularly high integration density can be achieved by the chips being contacted parallel to the longitudinal extent of the carrier substrate with their connection surfaces on conducting paths of conducting-path structures arranged on both sides of the carrier substrate and, after the chips have been brought into contact, by a meandering arrangement of the carrier substrate being effected with a view to forming the spatial chip arrangement.

The implementation of the two aforementioned process alternatives proves to be particularly advantageous if, after a chip has been brought into contact with the carrier substrate, an electrical examination of the chip is carried out via the connecting-path structure of the carrier substrate that is connected to a test device.

Irrespective of the relative arrangement of the chips in relation to the carrier substrate it proves to be advantageous if, with a view to preparing the contacting of the chips, the carrier substrate or substrates is/are fixed with one end in a clamping device. Hence the clamping device may also be used as a test device.

In particular in the case where it is a question of chips with reverse-side metallisation it proves to be advantageous if in each case prior to making contact with an additional chip a spacer device is arranged on the upper side of the previously contacted chip. On the one hand, given a suitable choice of material for the spacer device, an insulation between the chips is achieved. On the other hand, a static stabilisation of the stacked structure of the chip arrangement is also made possible. This stabilisation effect can be intensified still further if an adhesive material, for example an application of adhesive, is chosen for the spacer device.

In the case where a soldering material is used by way of connecting material it proves to be advantageous if the connecting material is applied in the form of isolated deposits of connecting material onto the conducting paths and/or the connection surfaces and is then activated by remelting. This type of application of deposits of soldering material is particularly suitable in the case where the chips are arranged transverse to the longitudinal extent of the carrier substrate. In the case where the chips are arranged parallel to the longitudinal extent of the flexible carrier substrate, with a view to connecting the chips to the carrier substrate a so-called "face-down technology" for establishing the connection, such as the "flip-chip process" for example, proves particularly suitable. Another possibility consists in the use of an adhesive material which is cured by UV irradiation—that is to say, is activated with a view to establishing a durable connection.

In order, finally, to enable an external contacting of the spatial chip arrangement that is as simple as possible, it proves to be particularly advantageous if, after the last chip has been brought into contact, a projecting length of the carrier substrate is firstly folded over the upper side of the chip and connected to the upper side and then a through-contact is made from the reverse side of the carrier substrate onto the conducting-path structure of the carrier substrate that is connected to the chip-connection surfaces. Alternatively it is also possible to make use, right from the beginning, of carrier substrates that are provided with an appropriate through-contact.

An advantageous alternative to this is obtained if, with a view to forming an external-contact arrangement on the chip arrangement prior to contacting the first chip or after contacting the last chip, a printed circuit board or a modified chip having an external-contact arrangement arranged on the outside and distributed in planar manner is contacted with the conducting paths of the carrier substrate via internal contacts arranged on the periphery of the printed circuit board or on the periphery of the chip and connected to the external-contact arrangement by means of a connection conducting-path structure.

In order to achieve a chip arrangement that is sealed off from environmental influences to the greatest possible extent and that has, moreover, a mechanical stability that is as great as possible, it is advantageous if, after contacting the desired number of chips, the chip arrangement produced is sealed with a view to forming a casing.

The spatial chip arrangement according to the invention comprises several chips arranged in various planes and electrically connected to one another, whereby the chips are connected via their peripheral connection surfaces to assigned conducting paths of a conducting-path structure of at least one carrier substrate, whereby the carrier substrate comprises a conducting-path structure arranged on at least one side of a carrier layer, the conducting paths of said conducting-path structure being connected to respectively assigned connection surfaces of the chips that are arranged transverse to the carrier substrate, or the carrier substrate comprises two conducting-path structures arranged on both sides of a flexible carrier layer and the conducting paths of each conducting-path structure are connected to respectively assigned connection surfaces of chips that are arranged on both sides parallel to the carrier substrate.

In an advantageous embodiment of the chip arrangement the chips are connected via several rows of peripheral connection surfaces to several carrier substrates which are respectively assigned to a row.

Irrespective of the basic design of the chip arrangement—that is to say, irrespective of whether a plurality of chips arranged transverse to the longitudinal extent of the carrier substrate are connected to the carrier substrate or whether the chips are connected to the carrier substrate parallel to the longitudinal extent of the latter—the spatial chip arrangement can be provided with an externally arranged external contact-surface arrangement. One possibility for the formation of this external contact-surface arrangement consists in providing, parallel to an outer chip forming an outer termination, a printed circuit board having an external contact arrangement arranged on its outside and distributed in planar manner which is connected to the conducting paths of the carrier substrate via internal contacts arranged on the periphery of the printed circuit board and connected to the external contact arrangement by means of a connection conducting-path structure.

With a view to increasing the mechanical stability of the entire chip arrangement it proves to be advantageous if spacer devices are provided between the chips.

If chips are arranged in the chip arrangement that comprise two peripheral rows of connection surfaces arranged offset in relation to one another and each conducting-path structure comprises a number of conducting paths corresponding to the total number of connection surfaces of both rows, with a conducting-path structure of particularly simple design a plurality of conducting paths can be connected to the peripheral connection surfaces of the chips.

A particularly high integration density can be achieved in the case where the chips are arranged parallel to the carrier substrate if the carrier substrate is arranged, at least zonally, in meandering form.

If the chip arrangement comprises a sealing material in the interspaces that are present between the carrier substrate and the chips it is possible to achieve a chip casing that is particularly stable mechanically and that is hermetically shielded against environmental influences. The casing may also be constructed by encasing or extrusion-coating with a suitable material.

BRIEF DESCRIPTION OF THE DRAWINGS

Various embodiments of the spatial chip arrangement are elucidated in more detail below by elucidation of the processes adopted for their manufacture with reference to the drawings. Illustrated are:

FIG. 5 the representation of a carrier substrate for the formation of a chip arrangement;

FIG. 6 a partial side view of a chip arrangement corresponding to FIG. 3;

FIG. 12 a variant of the chip arrangement represented in FIG. 9, formed with the carrier substrate represented in FIG. 8.

DETAILED DESCRIPTION OF A PREFERRED EMBODIMENT

Figure 1:
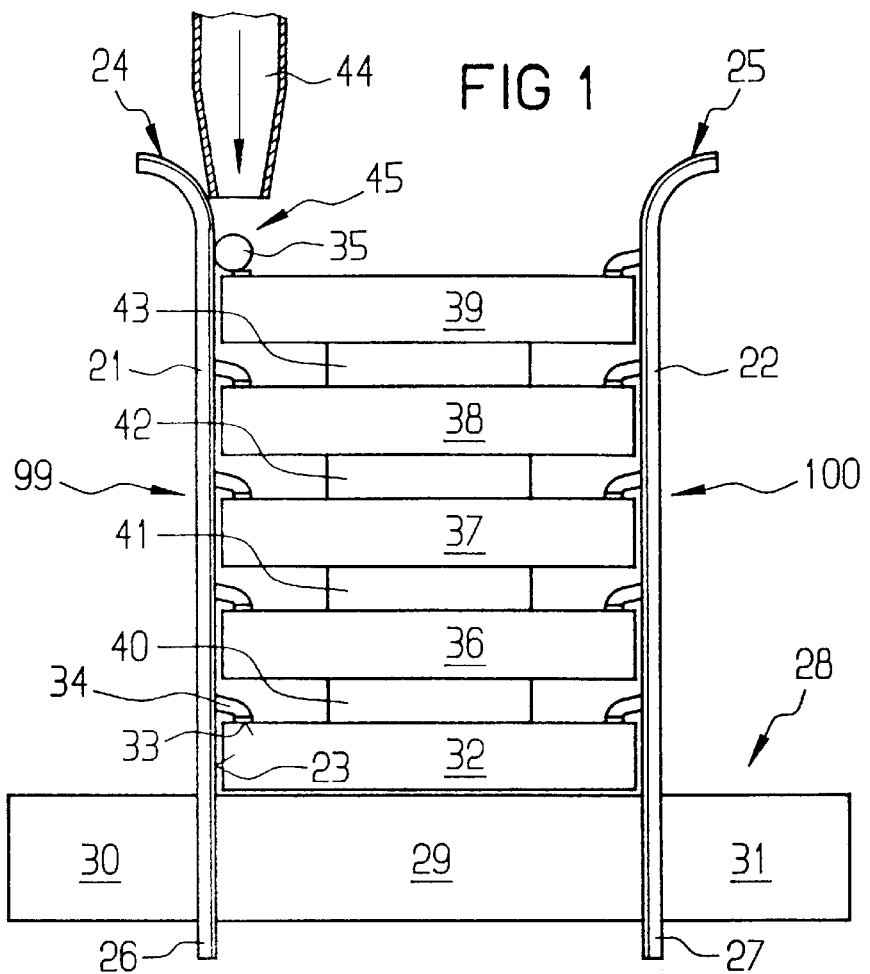
FIG. 1 an embodiment example of a stacked chip arrangement during manufacture in a variant of the process according to the invention.
Figure 3:
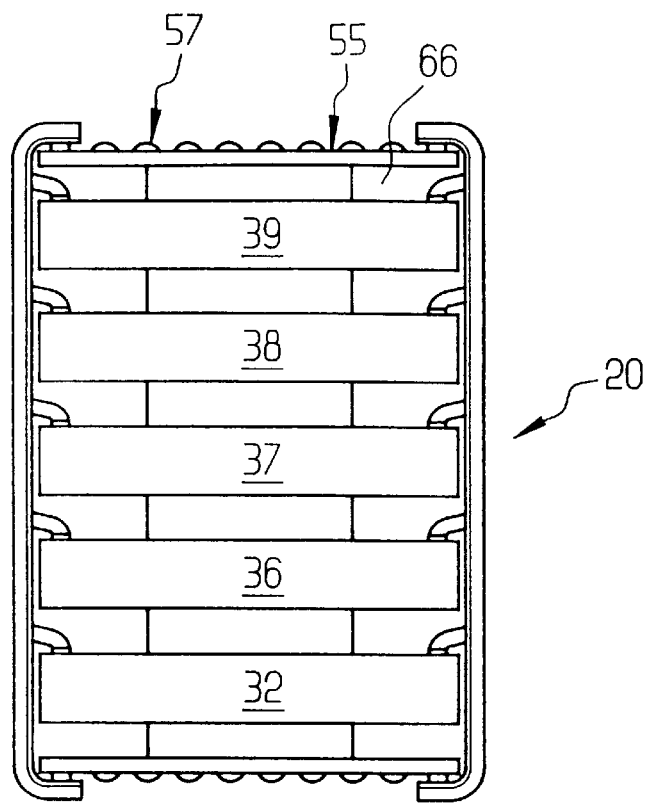
FIG. 3 a side view of the now finished chip arrangement that is shown in FIG. 1 during the manufacturing process.

FIG. 1 shows a process stage in the course of the manufacture of a chip-stack arrangement 20 that is represented in FIG. 3 in its final state. With a view to forming the chip-stack arrangement 20 (FIG. 3), in the case of the embodiment example currently represented two flexibly constructed carrier substrates 21, 22 are arranged with their conducting-path structures 24, 25, comprising a plurality of conducting paths 23, located opposite one another. With a view to fixing the carrier substrates 21, 22 in the relative position represented in FIG. 1, the ends 26, 27 of the carrier substrates 21, 22 are accommodated in a clamping device 28. The clamping device 28 comprises in the present case a spacer block 29, against which the ends 26, 27 of the carrier substrates 21 and 22 respectively are held clamped by clamping jaws 30, 31. The spacer block 29 is so dimensioned that a first chip 32 can be positioned in the manner represented in FIG. 1 between the carrier substrates 21, 22 with its peripheral connection surfaces 33, here in two rows extending perpendicular to the plane of the drawing, adjacent to the conducting paths 23 of the conducting-path structures 24, 25.

For this purpose the chip 32 rests with its reverse side in contact with the spacer block 29 of the clamping device 28.

In the case of the configuration represented in FIG. 1 the connection surfaces 33 of the chip 32 are provided via soldered connections 34 consisting of a remelted deposit of soldering material 35 with a view to forming an electrically conductive connection between the connection surfaces 33 and the assigned conducting paths 23 of the conducting-path structures 24 and 25.

From FIG. 1 it becomes clear that the chip-stack arrangement 20 (FIG. 3) is constructed in the manner of a sandwich from an alternating arrangement of additional chips 36 to 39 and intermediate layers of adhesive 40 to 43. These layers of adhesive 40 to 43 serve, on the one hand, to form a spacer device between adjacent chips 32, 36 and 36, 37 and 37, 38 and 38, 39 and also, on the other hand, on account of the flexible carrier substrates 21, 22, to bring about relative fixation of the entire arrangement.

As can be further gathered from FIG. 1, as represented in FIG. 1 on the basis of an example of the connection of the topmost chip 39, the deposits of solder material 35 for producing the soldered connections 34 are placed individually in positionally precise manner in the connecting region 45 between the connection surfaces 33 and the conducting paths 23 by means of a tool that takes the form of an application capillary 44. The necessary thermal energy for establishing the soldered connection by remelting may, with appropriate design of the application capillary 44 as a thermode device, be effected by the latter itself or also by a remelting device that is separate from it.

Figure 2:
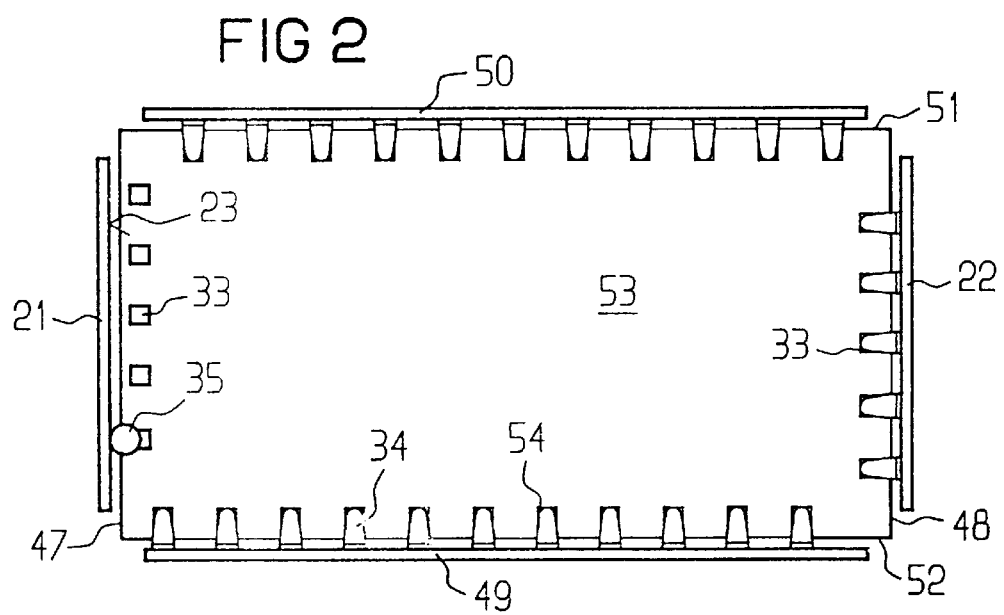
FIG. 2 a top view of a chip represented in FIG. 1.
Figure 4:
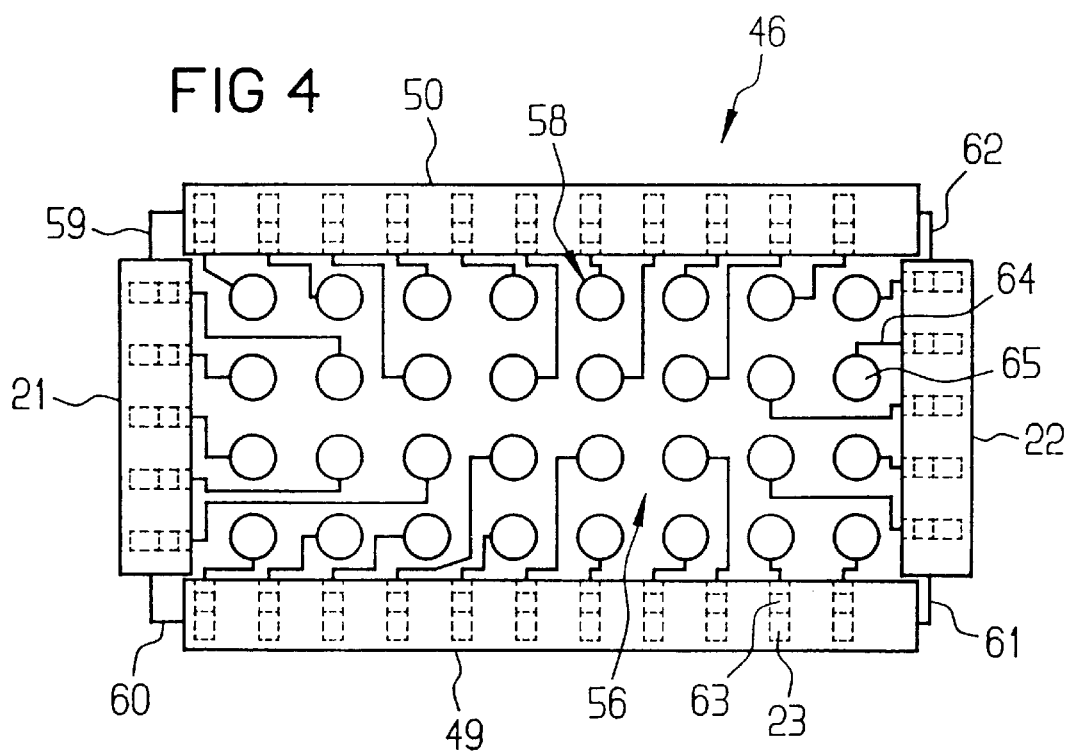
FIG. 4 a top view of a chip arrangement that is slightly modified in comparison with FIG. 3.

With the aid of the top view illustrated in FIG. 2 of a chip 53, at the same time a variant differing from the representation of the chip-stack arrangement 20 in FIG. 3 for the purpose of forming a chip-stack arrangement 46 illustrated in FIG. 4 is represented in which, differing from the representation in FIG. 1, in addition to the two carrier substrates 21, 22 arranged in opposing manner, which here are assigned to transverse sides 47, 48 of the chip 53, two further carrier substrates 49, 50 are provided which are assigned to longitudinal sides 51, 52 of the chip 53.

The chip-stack arrangement 46 represented in FIGS. 2 and 4 with here a total of four carrier substrates 21, 22 and 49, 50 is suitable, as is clearly evident from FIG. 2, for combination with chips of the same type as the chip 53 that are provided not only with two rows of peripheral connection surfaces 33, arranged in opposing manner, but moreover with two additional peripheral rows of connection surfaces 54, arranged in opposing manner.

Corresponding to the remarks made with reference to FIG. 1, the connection surfaces 54 of the chip 53 are, like the connection surfaces 33 of the chip 53, also connected via soldered connections 34 to the conducting paths 23 of the carrier substrates 21, 22 and 49, 50. Of course, it is also possible, in a manner differing from the soldering-material connections proposed here, for use to be made of other types of connection and connecting materials for bringing the connection surfaces 33 and 54 of the chips into electrical contact. For example, conductive adhesives may also be employed.

Irrespective of whether, with respect to the particular embodiment, it is a question of a chip-stack arrangement 20 or a chip-stack arrangement 46, the chip-stack arrangement is built up in the manner represented in FIG. 1—that is to say, by means of a sandwich-type layering of the chips. In this regard it is advisable, with a view to increasing the mechanical stability of the entire chip-stack arrangement 20 or 46, particularly in the case where use is made of flexibly constructed carrier substrates 21, 22 and 49, 50, to connect the individual chips 32 to 39 or 53 to one another by means of spacer devices 40 to 43 of adhesive design.

In the case where use is made of inherently rigid carrier substrates it is possible to dispense with said devices. Depending on the configuration of the connection surfaces of the chips that are to be integrated into a chip-stack arrangement, a chip-stack arrangement can also be built up with only one carrier substrate. In the case of carrier substrates of inherently rigid design the chip-stack arrangement can also be built up with an orientation differing from the orientation of the carrier substrates 21, 22 represented in FIG. 1—for example, with horizontal alignment of the carrier substrate or substrates.

Irrespective of the construction of the carrier substrates that are used in order to build up a chip-stack arrangement, the structure of a chip-stack arrangement 20 represented by way of example in FIG. 1 enables a component test of the individual chips 32 to 39 that takes place almost simultaneously with the composition of the chip-stack arrangement. For this purpose, after each application of an individual chip starting with chip 32 and completion of the electrically conductive connections—here taking the form of a soldered connection 34—to the conducting paths 23 of the carrier substrates 21, 22, an electrical examination of the particular chip last inserted is carried out via the conducting paths 23 of the carrier substrates 21, 22. A test device suitable for this purpose, which is not represented in any detail, can be connected as a separate device to the ends 26 and 27 of the carrier substrates 21, 22 that are clamped in the clamping device 28. But there is also the possibility of designing the clamping device 28, in particular the spacer block 29 of the clamping device 28, as an electrical test device or at least as a contact device for an electrical test device.

The arrangement represented in FIG. 1 for the formation of a chip-stack arrangement 20 enables, in particularly simple manner, a continuous manufacture of chip-stack arrangements 20. To this end the carrier substrates 21 and 22 are held ready in the form of endless substrates arranged on rollers or a similar supply device and are moved forward one carrier-substrate section 99, 100 at a time following a release of the clamping device 28, the carrier-substrate sections 99, 100 being so dimensioned that the desired number of chips can be arranged between the carrier-substrate sections 99, 100 with a view to forming the chip-stack arrangement 20. After completion of the arrangement the carrier-substrate sections 99, 100 which are now connected to the chips are separated by means of a suitable separating device, which is not represented here, adjacent to the clamping device 28 so that, as a result of a further feed movement, the next carrier-substrate sections 99, 100 can be equipped with chips.

In order to simplify contacting of the finished chip-stack arrangement 20 or 46, the chip-stack arrangement 20 or 46 may be sealed at least to one side with a printed circuit board 55 or 56 respectively which, as represented by way of example in FIGS. 3 and 4, may be provided with an external contact-surface arrangement 57 or 58 in the manner of a "ball-grid array".

As becomes clear in particular from the top view represented in FIG. 4, for the purpose of connection to the printed circuit board 56 the upper ends of the carrier substrates 21, 22 and 49, 50, which here are of flexible construction, are folded over peripheral contact edges 59, 60, 61 and 62 of the printed circuit board 56 in such a way that the conducting paths 23 of the carrier substrates 21, 22 and 49, 50 can be contacted in a covering position with internal contact surfaces 63 of the printed circuit board 56. From the internal contact surfaces 63 contact paths 64 lead to the individual external contact surfaces 65 of the printed circuit board 56 that are configured in the external contact-surface arrangement 58 described previously.

As FIG. 3 shows, a printed circuit board 55 or another device enabling an external contact-surface arrangement can be arranged both at the upper and at the lower end of a chip-stack arrangement 20 or 46. With a view to forming a sealed case for the chips 32 and 36 to 39 or 53 that are arranged in the chip-stack arrangement 20 or in the chip-stack arrangement 46, the chip-stack arrangement 20 or 46 is filled out in the chip interspaces 66 represented in FIG. 3 on the basis of an example of the chip-stack arrangement 20 with a sealing material which, furthermore, may also additionally encase the carrier substrates. Chip-stack arrangements that are encased and provided with an external contact-surface arrangement can be used to particular advantage in connection with SMD technology.

FIG. 5 shows, represented by fully drawn lines, a flexible carrier substrate 67 in a representation that is spread out in the plane, in which an external contact-surface arrangement 68 is formed integrally in a flexible carrier layer 69 of the carrier substrate 67. To this end the conducting-path structure 71 that is composed of individual conducting paths 70 merges in the end region of the carrier substrate 67 with a connection conducting-path structure 72. The connection conducting-path structure 72 comprises contact paths 73 which are arranged on the same side of the carrier layer 69 as the conducting paths 70 of the conducting-path structure 71. On the opposite side of the carrier layer 69, located opposite the free ends of the contact paths 73, external contact surfaces are provided that are formed here by soldering points 74 which are connected to the contact paths 73 via through-contacts that are not represented in any detail.

The carrier substrate 67 represented in FIG. 5 by solid lines enables, analogously to the two carrier substrates 21, 22 represented in FIG. 1, the combination of several chips 32 and 36 to 39 so as to form a chip-stack arrangement, whereby the carrier substrate 67 represented by solid lines is suitable for combination with chips that, like the chips 32 and 36 to 39 represented in FIG. 1, comprise two opposite rows of peripheral connection surfaces. Proceeding from the embodiment example represented in FIG. 5, the carrier substrate 67, which is provided with a total of 32 conducting paths 23, is suitable to connect chips comprising 16 peripheral connection surfaces in each of two opposite rows. The connection of the chip-connection surfaces to the conducting paths 23 can be effected in a manner analogous to that elucidated with reference to FIG. 1. As indicated in FIG. 5 by two lateral strands 97, 98 attached laterally to a principal strand 96 of the carrier substrate 61 and represented by a dashed line, a carrier substrate which in the manner of the carrier substrate 67 is provided with an integrated arrangement of external-contact connection surfaces can also be used for equipping with chips comprising a total of four rows of peripheral connections. In this case additional external contact surfaces are then to be provided in the external contact-surface arrangement.

FIG. 6 shows, here by way of example with reference to the case of a chip-stack arrangement with two carrier substrates 21, 22, another possibility for forming an external contact-surface arrangement 75. With a view to forming the external contact-surface arrangement 75, after establishing the contact of the conducting paths 23 with connection surfaces 33 of an uppermost chip 39 the carrier-substrate ends 76, 77 of the carrier substrates 21, 22 are folded over in the direction of the upper side or contact-surface side of the chip 39. For defined positioning of the carrier-substrate ends 76, 77 and securing thereof in relation to the chip 39 an adhesive spacer device 78 is interposed, for example in the manner of the spacer devices 40 to 43 of the arrangement represented in FIG. 1.

With a view to forming the external contact-surface arrangement 75 the conducting paths 23 are through-contacted in the region of the carrier-substrate ends 76, 77 onto the reverse side of the carrier substrates 21, 22. This can be effected by application and remelting of solder balls in carrier-layer recesses which open out onto the reverse side of the conducting path 23, so that, as represented in FIG. 6, the external contact surfaces of the external contact-surface arrangement are formed by soldering points 79.

Figure 7:
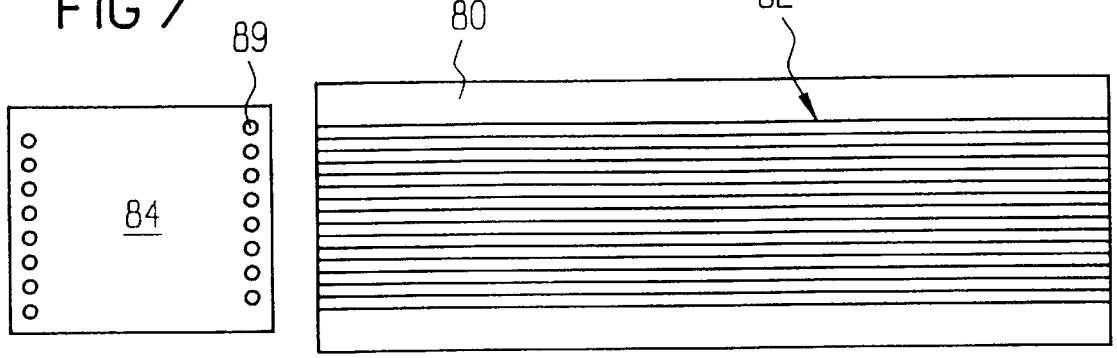
FIG. 7 the contact surface of a chip with a top view of an assigned carrier substrate.
Figure 8:
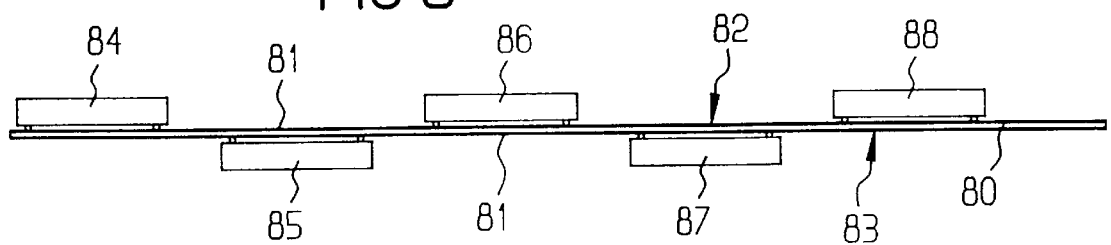
FIG. 8 a carrier substrate that is contacted with chips on both sides with a view to forming another embodiment of a chip arrangement.

FIG. 8 shows a configuration consisting of a carrier substrate 80, which is provided on both sides with conducting-path structures 82, 83 comprising conducting paths 81, and chips 84, 85, 86, 87, 88 which are contacted, offset in alternating manner as represented in FIG. 8, onto both conducting-path structures 82 and 83 of the carrier substrate 80. The contact may be established in accordance with the flip-chip process which is known per se, in which the connection surfaces 89 (FIG. 7) of the chips 84 to 88, which are provided with contact metallisations that are not represented in any detail, are placed against the conducting paths 81 of the conducting-path structures 82 and 83 that are assigned respectively to the individual connection surfaces 89 and, subject to the effect of pressure and temperature, are connected to said conducting-path structures. From the representation of a chip 84 and the conducting-path structure 82 of the carrier substrate 80 located alongside one another it becomes clear that a conducting path 81 is assigned to each connection surface 89.

As already explained in detail with reference to FIG. 1, also in the case of the configuration represented in FIG. 8 an electrical component test can be carried out after each contacting of a chip 84 to 88 by utilising the conducting paths 81 of the carrier substrate 80. Precisely as in the case of the arrangement represented in FIG. 1, in the event of a component failure being detected the chip in question can then be removed from the carrier substrate 80 by releasing the connection—by unsoldering for example—and exchanged for a new chip.

Figure 9:
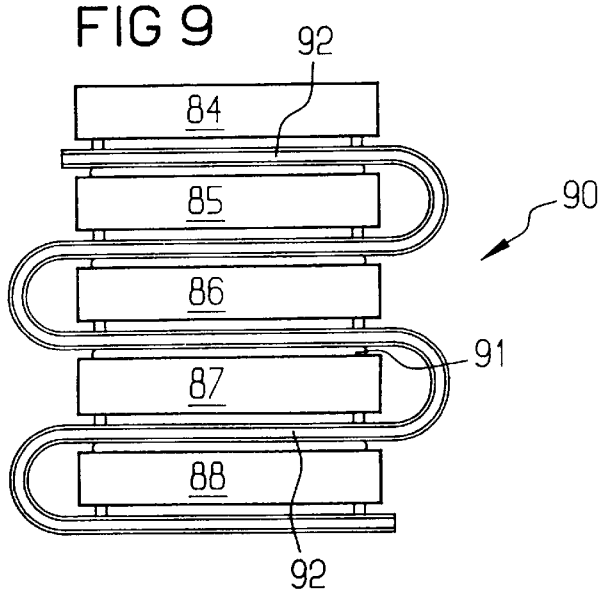
FIG. 9 a chip arrangement formed with the carrier substrate represented in FIG. 8.

After the component tests have been carried out the flexible carrier substrate 80 can be arranged, with a view to forming the chip-stack arrangement 90 represented in FIG. 9, in meandering form, whereby in each case an adhesive interlayer 91 for the purpose of fixing the meandering structure is arranged between a chip 84 to 88 and an adjacent carrier-substrate section 92. With a view to forming an external contact-surface arrangement a procedure that is analogous to the examples already explained in detail above may be adopted. Furthermore, analogously to the comments concerning the chip-stack arrangements 20 and 46, also in the case of the chip-stack arrangement 90 a cast seal, with an epoxy resin for example, is possible in order to make possible a casing of the chip-stack arrangement 90.

Figure 10:
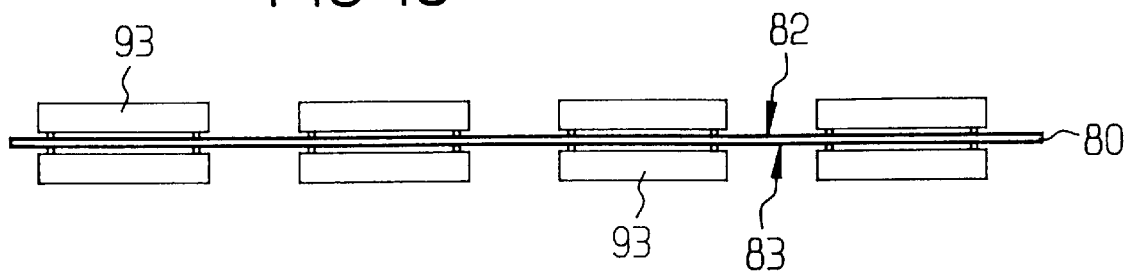
FIG. 10 a variant of the carrier substrate represented in FIG. 8 with an arrangement of chips differing from FIG. 8.

FIG. 10 shows a configuration that is modified in comparison with FIG. 8, in which chips 93 are also arranged on both sides of the carrier substrate 80 that is provided on both sides with the conducting-path structure 82 and 83, but in which, in each case, they are located above one another in pairs.

Figure 11:
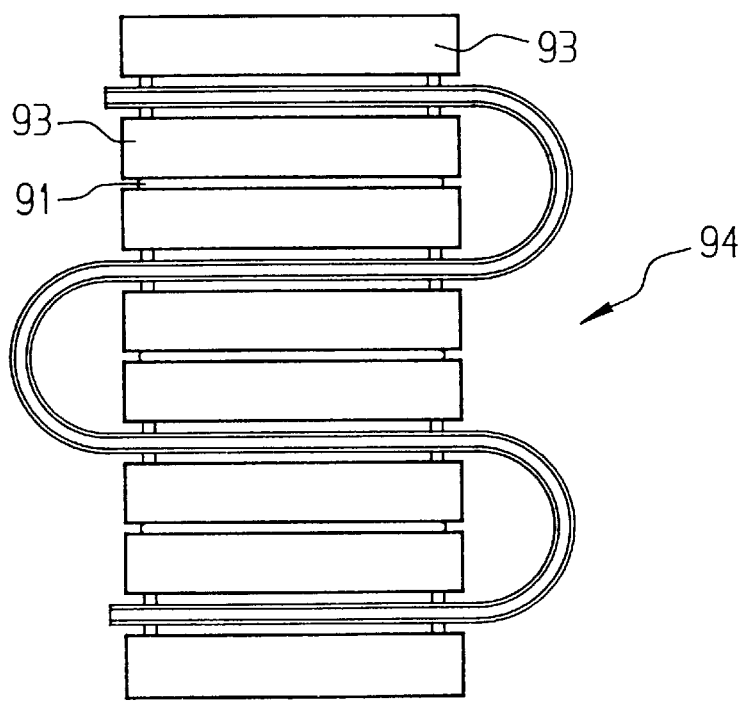
FIG. 11 a chip arrangement formed with the carrier substrate represented in FIG. 10.

FIG. 11 shows an example of a chip-stack arrangement 94 which is formed proceeding from the configuration represented in FIG. 10. In this case the carrier substrate 80 is again arranged in meandering form, the adhesive interlayers 91 now being arranged in each case between adjacent chips 93.

FIG. 12 shows, finally, an alternative arrangement, proceeding from the configuration represented in FIG. 8, of a chip-stack arrangement 95 in order to make it clear that with the configuration represented in FIG. 8 or also in FIG. 10 it is possible to achieve stack arrangements of arbitrary construction.

What is claimed is:

1. A spacial chip arrangement comprising
    a plurality of chips arranged in a plurality of planes and electrically connected to one another,
    the plurality of chips include each a peripheral connection surface;
    a conducting structure includes a conducting path structure being an integral part of a carrier substrate and having conductive paths;
    the peripheral connection surfaces are directly electrically connected to assigned conducting paths by melted solder bumps;
    the connection surfaces are arranged in a plane transverse to the carrier substrate;
    the conducting path structure is arranged on at least one side of the carrier substrate and extends parallel to a surface plane thereto and the chips being arranged transverse to the carrier substrate;
    wherein the carrier substrate is formed of a flexible material comprises a plurality of carrier substrates, and wherein the plurality of chips are connected via several rows of peripheral connection surfaces to the plurality of carrier substrates which are assigned respectively to a row of connection surfaces.

2. The spacial chip arrangement according to claim 1, wherein parallel to one chip, forming an outertermination, a printed circuit board having an external contact-surface arrangement is arranged on its outside and distributed in planar manner is contacted with the conducting paths of the carrier substrate via its internal contacts arranged on periphery of the printed circuit board and connected to the external contact-surface arrangement by means of a connection conducting-path structure.

3. The spacial chip arrangement according to claim 2, further comprising spacer devices arranged between the chips.

4. The spacial chip arrangement according to claim 3, wherein the chips comprise two peripheral rows of connection surfaces arranged in offset manner in relation to one another and each conducting-path structure comprises a number of conducting paths corresponding to the total number of connection surfaces of both rows.

5. The spacial chip arrangement according to claim 4, wherein the carrier substrate is arranged in a winding form.

6. The spacial chip arrangement according to claim 5, wherein the chip arrangement is formed into a block by a sealing material.

7. The spacial chip arrangement according to claim 1, wherein the conductive paths extends continuously along a side of the carrier substrate and being positioned such as to face the plurality of chips.

* * * * *